United States Patent [19]
Wheeler

[11] Patent Number: 5,229,548
[45] Date of Patent: Jul. 20, 1993

[54] CIRCUIT BOARD HAVING A STAMPED SUBSTRATE

[75] Inventor: Dale K. Wheeler, Fallston, Md.

[73] Assignee: Black & Decker Inc., Newark, Del.

[21] Appl. No.: 732,459

[22] Filed: Jul. 18, 1991

Related U.S. Application Data

[60] Division of Ser. No. 438,106, Nov. 16, 1989, Pat. No. 5,035,049, which is a division of Ser. No. 277,471, Nov. 23, 1988, which is a continuation of Ser. No. 923,807, Oct. 27, 1986, Pat. No. 4,897,919.

[51] Int. Cl.⁵ ............................................... H05K 1/00
[52] U.S. Cl. ..................................... 174/262; 361/401; 29/832
[58] Field of Search ............. 174/250, 251, 262, 264, 174/265, 266, 267; 361/397, 414, 400, 401, 404; 29/831, 845, 837, 838, 842, 844, 852, 622, 505, 521, 832; 200/237, 275

[56] References Cited

U.S. PATENT DOCUMENTS

| | | | |
|---|---|---|---|
| 3,541,223 | 11/1970 | Helms | 174/265 X |
| 3,660,726 | 5/1972 | Ammon et al. | 174/262 X |
| 3,670,409 | 6/1972 | Reimer | 174/267 X |
| 3,685,002 | 8/1972 | Kennedy | 174/267 X |
| 3,945,808 | 3/1976 | Sheesley et al. | 200/275 X |
| 3,967,162 | 6/1976 | Ceresa et al. | 174/264 X |
| 3,977,074 | 8/1976 | Furnival | 174/264 X |
| 4,028,798 | 6/1977 | Bechard et al. | 361/400 X |
| 4,371,744 | 2/1983 | Badet et al. | 361/414 X |
| 4,394,710 | 7/1983 | Brower et al. | 361/401 |
| 4,435,741 | 3/1984 | Shimizu et al. | 29/521 X |

*Primary Examiner*—Leo P. Picard
*Assistant Examiner*—Trinidad Korka
*Attorney, Agent, or Firm*—Harness, Dickey & Pierce

[57] ABSTRACT

A method and apparatus is provided for forming a power distribution system during a punching operation. A planar member of conductive material is located proximate to the substrate upon which the power distribution system is to be formed. A punch used to form the conductors from the planar member and deposit the conductors on the substrate. The action of the punch causes mechanical interference between the conductor and the substrate thereby securing the conductor to the substrate.

5 Claims, 6 Drawing Sheets

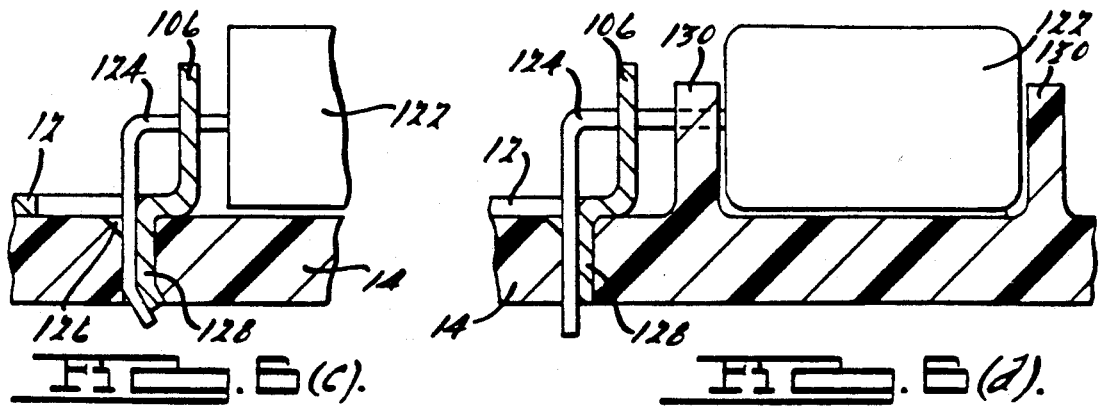
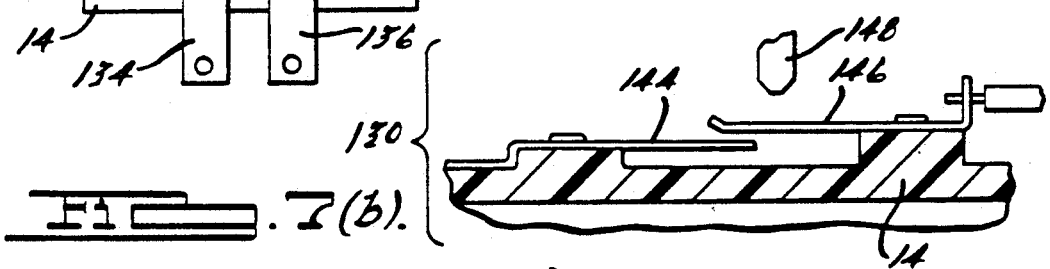
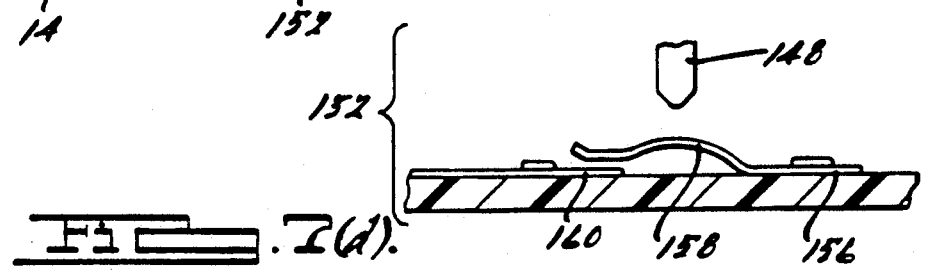
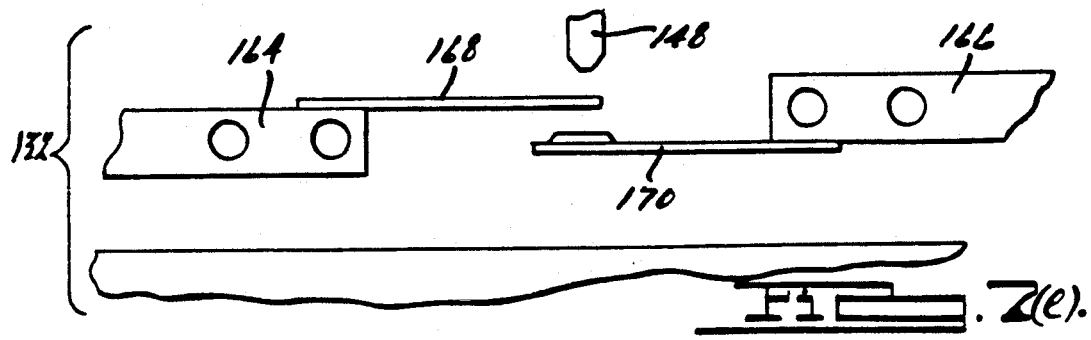

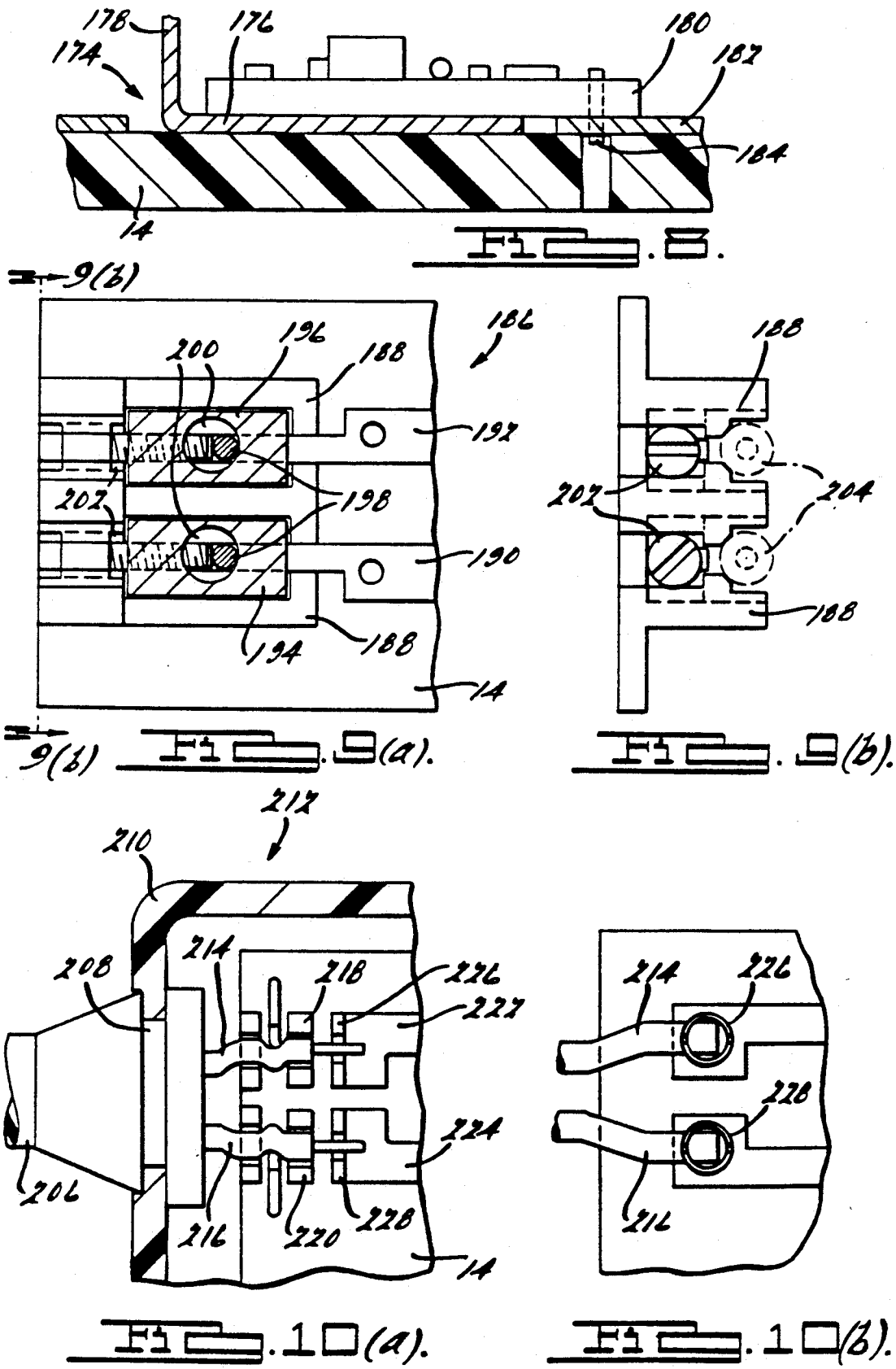

CIRCUIT BOARD HAVING A STAMPED SUBSTRATE

This is a division of U.S. patent application Ser. No. 438,106 now U.S. Pat. No. 5,035,049, filed Nov. 16, 1989, which is a division of Ser. No. 277,471, filed Nov. 23, 1988, which was a continuation of Ser. No. 923,807, filed Oct. 27, 1986 now U.S. Pat. No. 4,897,919.

BACKGROUND AND SUMMARY OF THE INVENTION

This invention relates to the field of stamped substrates, and in particular to the fabrication and attachment of conductors to substrates which may then be used in a power distribution system for circuit board assemblies.

Appliances and other articles often use power distribution systems to deliver electrical power from power cords to the electrical components in the appliance. To accommodate the relatively high wattage which the power distribution systems carry, the conductors in such power distribution systems have to be relatively large. Because of the conductor size, assembly of such power distribution systems are often performed manually.

There are several problems associated with manual assembly of power distribution systems. First, the cost of manually assembling the power distribution systems is often as much as 20–30% of the total assembly cost. In addition, manual assembly of power distribution systems occasionally results in premature failure due to open or intermittent connections formed during assembly. For these reasons, it is desirable to automate as much of the assembly as possible.

One technique for automatic assembly of circuit board patterns is shown in U.S. Pat. No. 2,971,249. This patent discloses a three-step process for depositing conductive patterns on substrates. A die-blanking press is used to form and deposit a conductive pattern on a base material. The die-blanking operation is followed by a punching operation and a molding operation. The conductive pattern is bonded by an adhesive material deposited on the substrate or by using a separate molding operation.

Accordingly, it is the primary object of the present invention to provide an improved power distribution system for use in appliances and other articles which does not require adhesive bonding or molding to secure conductors to substrates.

In addition, it is a further object of the present invention to provide a method for automatically assembling power distribution systems.

Another object of the present invention is to provide a power distribution system that is reliable, relatively inexpensive, and simple to fabricate.

In general, the method of assembling a power distribution system according to the present invention comprises: locating a planar member proximate to the substrate upon which the power distribution system is to be assembled. A punch is then used to punch a planar member so as to form and attach the conductors of the power distribution system to the substrate by creating mechanical interference between the conductor and the substrate.

Additional objects and advantages of the present invention will become apparent upon reading the following detailed description of the preferred embodiments which make reference to the accompanying drawings in which:

BRIEF DESCRIPTION OF THE DRAWINGS

FIGS. 6(a)–(d) illustrate the manner in which a component with an axial lead is connected to a stamped substrate formed by using the apparatus shown in FIG. 1;

FIGS. 7(a)–(e) illustrate the manner in which the apparatus shown in FIG. 1 may be used to form switches on a stamped substrate;

FIG. 8 illustrates a heat sink which is formed by the apparatus shown in FIG. 1;

FIGS. 9(a) and (b) is a molded cordset connector block which may be formed in part by the apparatus shown in FIG. 1; and FIGS. 10(a) and (b) illustrates a power distribution system which is formed using the apparatus shown in FIG. 1.

DETAILED DESCRIPTION OF THE PREFERRED EMBODIMENT

Figure 1:
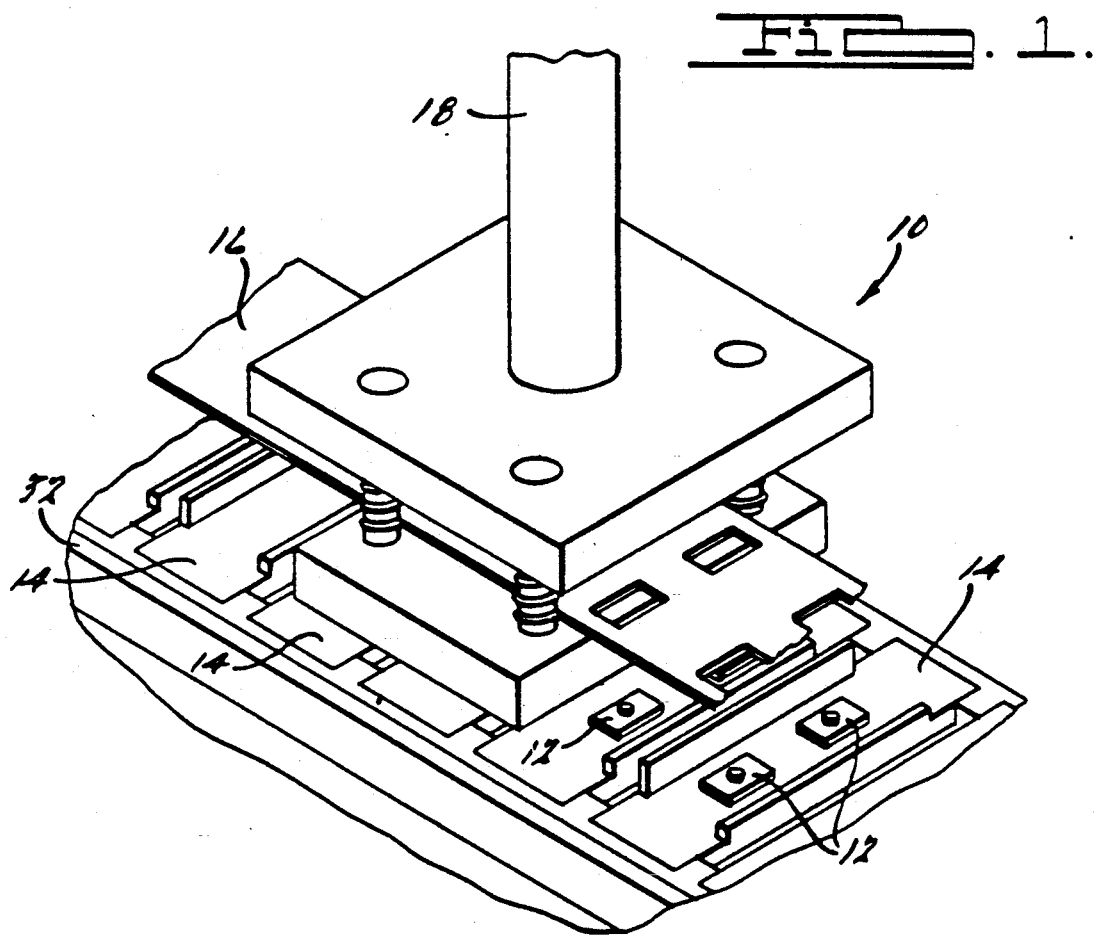
FIG. 1 illustrates the apparatus for forming stamped substrates according to the present invention.
Figure 2:
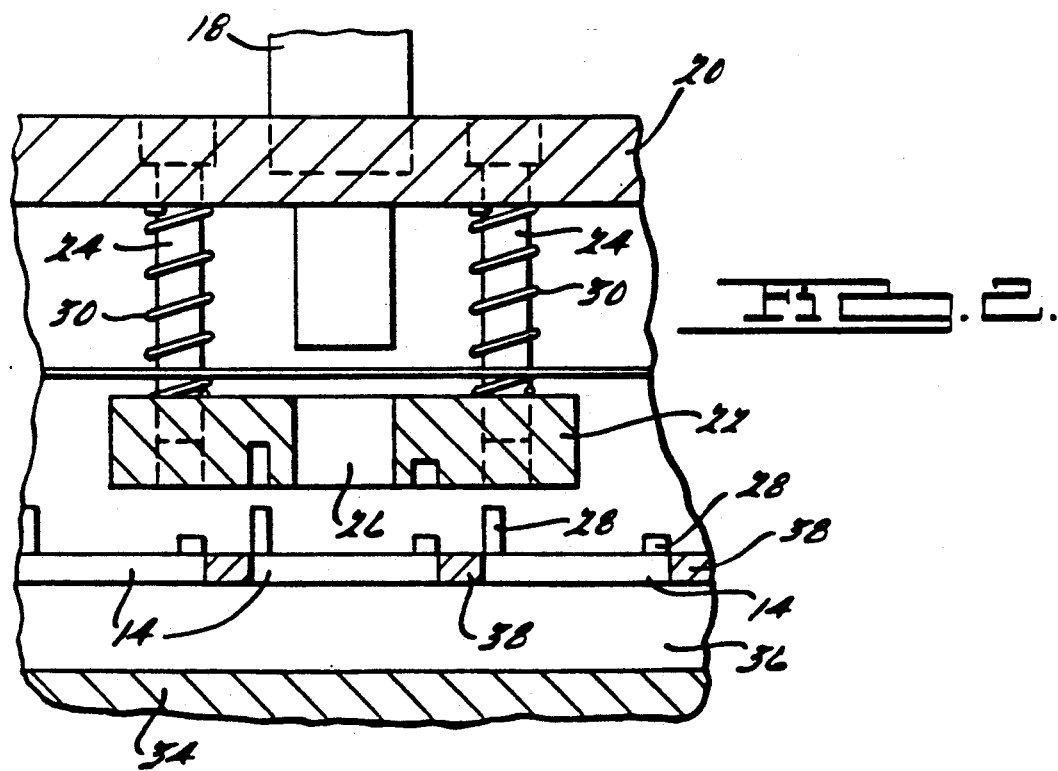
FIG. 2 is a cross-sectional view of the apparatus for forming stamped substrates taken through line 2—2 of FIG. 1.

Referring to FIG. 1, an apparatus 10 is shown for depositing the conductors 12 on the substrates 14 according to the present invention. The substrates 14 may be formed from molded plastic, stamped fiberboard, or sheet plastic extrusion, though it is to be understood other materials may be used. The apparatus 10 receives a carrier strip 16 from which the conductors 12 are formed. The carrier strip 16 is a planar member fabricated from copper, brass, bronze, aluminum, or other suitable materials.

To form the conductors 12 from the carrier strip 16, the apparatus 10 includes a punch 18 which sequentially blanks the carrier strip 16 thereby forming the conductor 12. Once the conductors 12 are formed by the punch 18 during the blanking operation, the punch 18 deposits the conductors 12 onto the substrates 14. The conductors 12 are secured to the substrate 14 by mechanical interference between the conductors 12 and the substrates 14 in the manner described below. To support the punch 18, the apparatus 10 includes a punch plate 20 and a die plate 22. The punch plate 20 is vertically disposed over the die plate 22 and is connected by a plurality of posts 24. The posts 24 insure that the geometric relationship between the punch plate 20 and the die plate 22 is maintained. The die plate 22 floats on the posts 24 so that the die plate 22 will not interfere with the projections 28 on the substrate 14 during the indexing operation described below. To permit separation of the punch plate 20 from the die plate 22 during the upward stroke of the punch 18, a plurality of springs 30 are provided. The springs 30 are used to bias the position of the punch plate 20 in a direction opposing the die plate 22.

To deliver substrates 14 to the apparatus 10, an indexing mechanism 32 is provided. The indexing mechanism 32 includes a base portion 34 and a movable member 36 with a plurality of lateral members 38. The indexing mechanism 32 sequentially delivers the substrate 14 to a position below the punch 18 by movement of the lateral members 38. After the punch 18 blanks and deposits the conductors 12 on a particular substrate 14, the lateral member 38 moves a new substrate 14 into position underneath the punch 18.

Figures 3A, 3B:
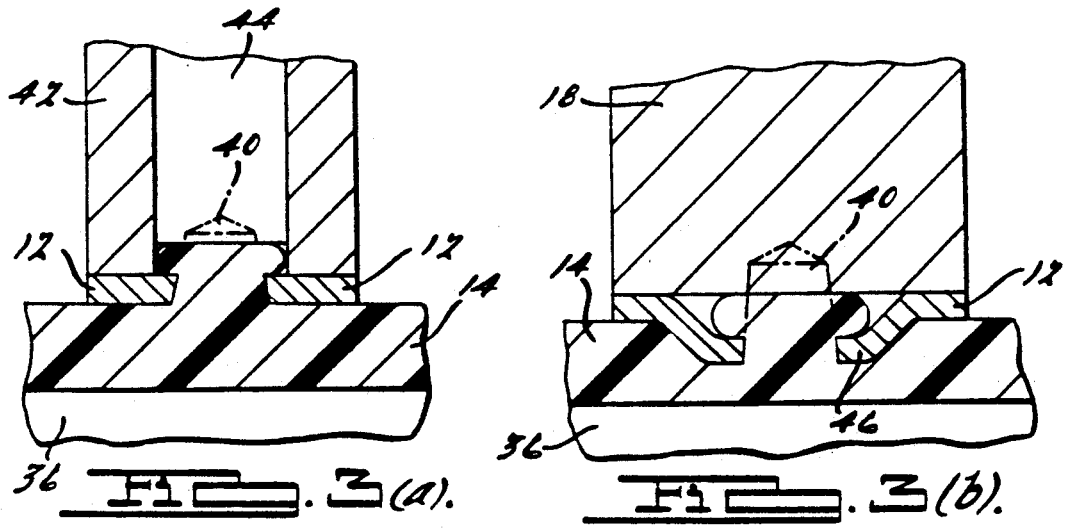
FIGS. 3(a)–(l) illustrate various manners in which a conductor can be secured to a substrate using the apparatus shown in FIG. 1.

Several means for securing conductors 12 to the substrates 14 may be used. As shown in FIG. 3(a), the substrate 14 has a projection 40 which is initially able to pass through an aperture in the conductor 12. After the conductor 12 has been deposited on to the substrate 14 by a first portion 42 of the punch 18, a second portion 44 of the punch 18 deforms the projection 40 into a bead. The mechanical interference between the projection 40 and the conductor 12 prevents the removal of the conductor 12 from the substrate 14. In FIG. 3(b), the substrate 14 includes a depressed area 46 having a centrally located projection 40. To secure the conductor 12, the punch 18 deforms the projection 40 causing the projection 40 to form a bead within the depressed area 46. The mechanical interference between the projection 40 and the conductor 12 secures the conductor 12 to the substrate 14. By causing the projection 40 to deform in this manner, the possibility that the projection 40 will interfere with subsequent operations is minimized as the projection 40 is located below the surface of the conductor 12.

Figures 3C, 3D, 3E:
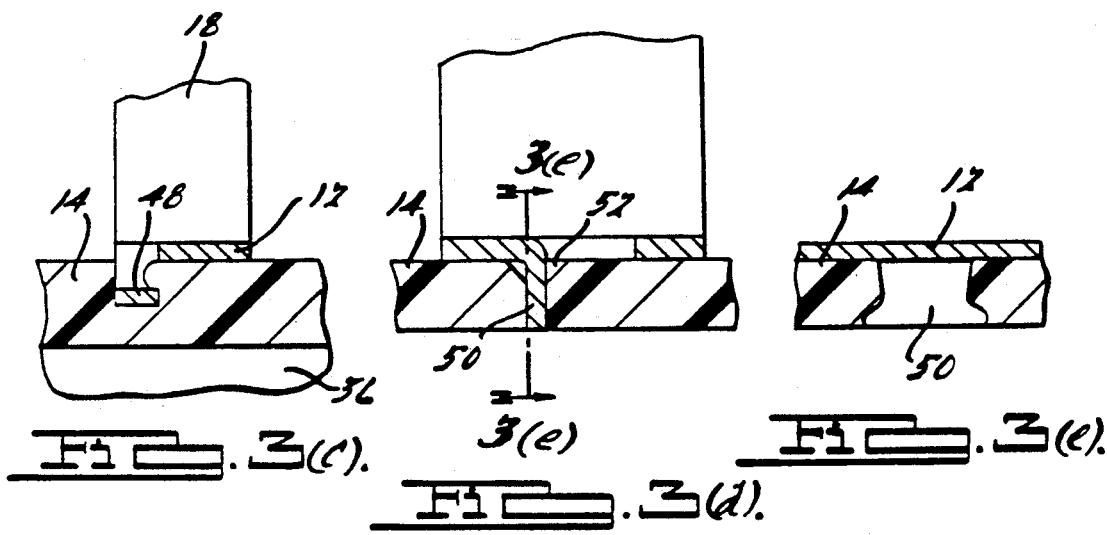
Figures 3F, 3G:
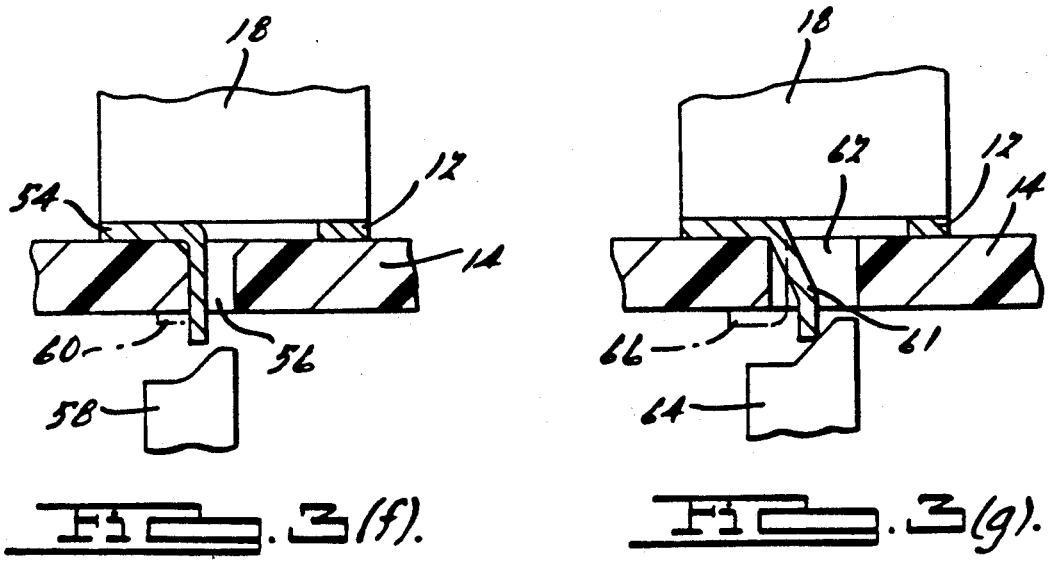

Another means for securing the conductor 12 to the substrate 14 is shown in FIG. 3(c). After the conductor 12 is blanked as described above, the punch 18 forces a portion 48 of the conductor 12 into the substrate 14. The material from which the substrate 14 is made then flows into the region of the substrate 14 which is lanced thereby securing the conductor 12 to the substrate 14. In FIG. 3(d), the punch 18 forces a portion 50 of the conductor 12 through an aperture 52 in the substrate 14. Then the end of the portion 50 is then deformed as shown in FIG. 3(e). In FIG. 3(f), the punch 18 is used to force a portion 54 of the conductor through an aperture 56 in the substrate 14. A roll set 58 is then used to deform a region 60 of the portion 54 of the conductor 12 so as to secure the conductor 12 to the substrate 14. A similar means for securing the conductor 12 to the substrate 14 is shown in FIG. 3(g), in which the punch 18 forces a portion 61 of the conductor 12 through an aperture 62 in the substrate. The roll set 64 is then used to deform a region 66 of the portion 61 of the conductor 12 to secure the conductor 12 to the substrate 14.

Figure 3H:
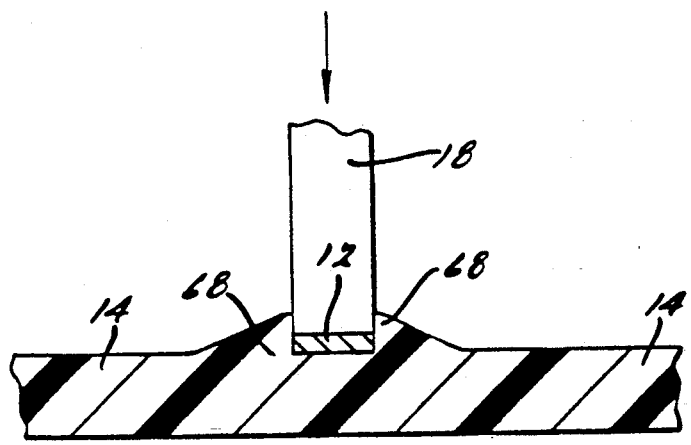
Figure 3I:
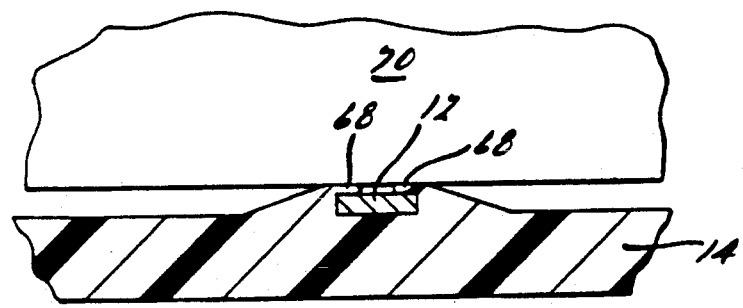
Figure 3J:
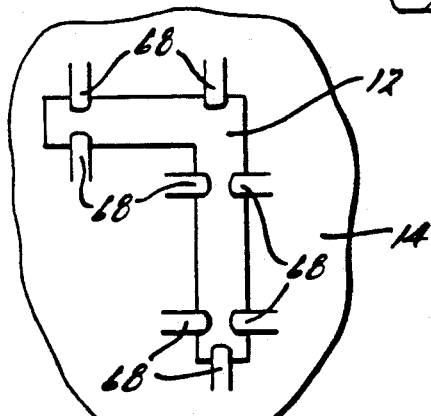

Further means for securing the conductor 12 to a substrate 14 is shown in FIG. 3(h)-3(i). The substrate 14 is formed with a plurality of ribs 68 which are able to receive the conductor 12. The conductor 12 is blanked from the carrier strip 16 and then deposited on the substrate 14 between the ribs 68. A second punch 70 is then used to cold stake the ribs 68. The mechanical interference between the ribs and the conductor 12 thereby secures the conductor 12 to the substrate 14.

Figure 3K:
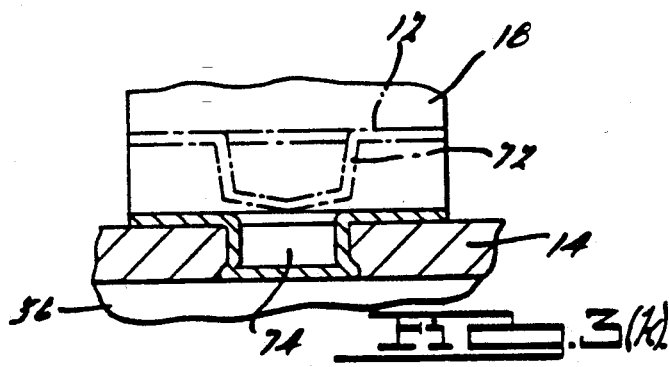
Figure 3L:
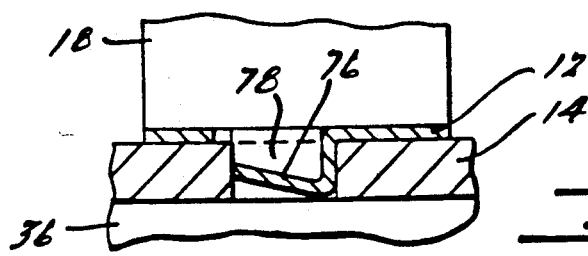

Additional means for securing the coordinator 12 to the substrate is shown in FIGS. 3(k)-3(l). In FIG. 3(k), the carrier strip 16 contains a lance 72 which is able to be inserted into an aperture 74 in the substrate 14 during blanking. As the top of the lance 72 reaches the movable member 36 during insertion, the edges of the lance 72 are forced against the sides of the aperture 74, thereby mechanically securing the conductor 12 to the substrate 14. As shown in FIG. 3(l); the carrier strip 16 contains a finger trapping lance 76 on the conductor 12. The finger trapping lance 76 is forced into the aperture 78 in the substrate 14 so as to mechanically interfere with the substrate 14. While several means for forming and securing the conductor 12 to the substrate 14 by mechanical interference are shown, other suitable techniques may be used.

Figures 4A, 4B, 4C:
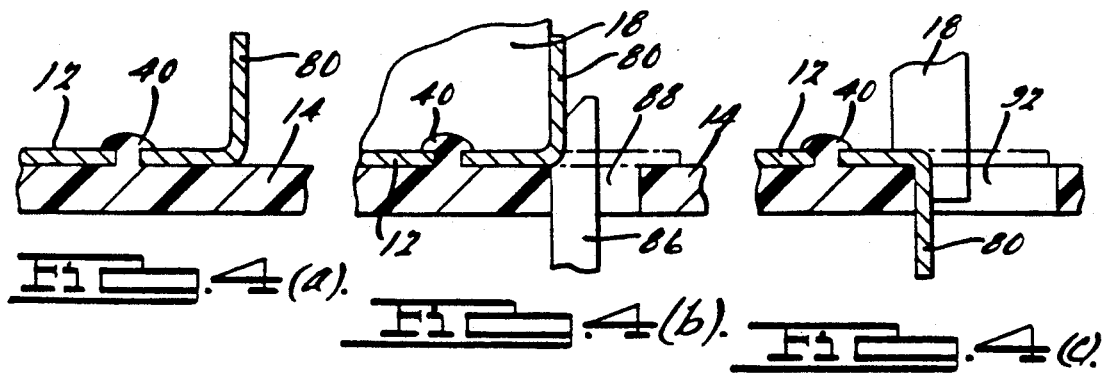
FIGS. 4(a)–(c) illustrate the manner in which vertically oriented conductor projections can be formed and secured using the apparatus shown in FIG. 1.

The apparatus 10 may be used to form and attach vertical conductor projections to the substrate 14. As shown in FIG. 4(a), a conductor 12 having a projection 80 is formed during the blanking operation. The projection 80 is then secured to the substrate 14 in the manner as discussed above. The apparatus 10 may also be used to form the conductor 12 having the projections 80 in the manner shown in FIG. 4(b), in which a form punch 86 is displaced vertically through an aperture 88 in the substrate 14 to cause the projection 80 to form against the punch 18. Alternatively, the punch 18 may force the projection 80 of the conductor 12 through an aperture 92 in the substrate 14 as shown in FIG. 4(c). While several means for forming and securing vertical conductor projections to substrates have been described above, it will be understood that other suitable means may also be used.

Figure 5:
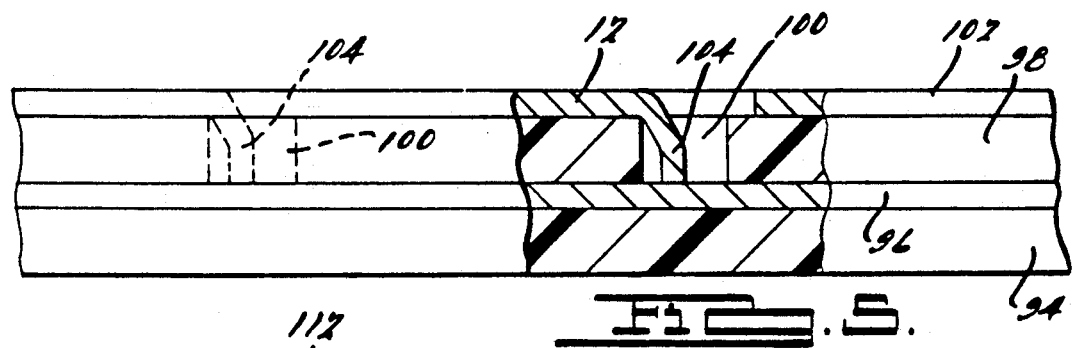
FIG. 5 illustrates a multilayer circuit board which may be formed using the apparatus shown in FIG. 1.

The apparatus 10 may also be used to form multilayer circuit boards. As shown in FIG. 5, a substrate 94 is provided to which a first conductor layer 96 is attached. An insulator layer 98 having a plurality of apertures 100 is then secured to the conductor layer 96, upon which a second conductive layer 102 is attached. The second conductive layer 102 has a plurality of projections 104 which are able to extend through the apertures 100 in the insulator layer 98 and electrically communicate with the first conductor layer 96. Accordingly, electrical power may be delivered from the first conductor layer 96 to the second conductive layer 102 through the projections 104.

Figure 6A:
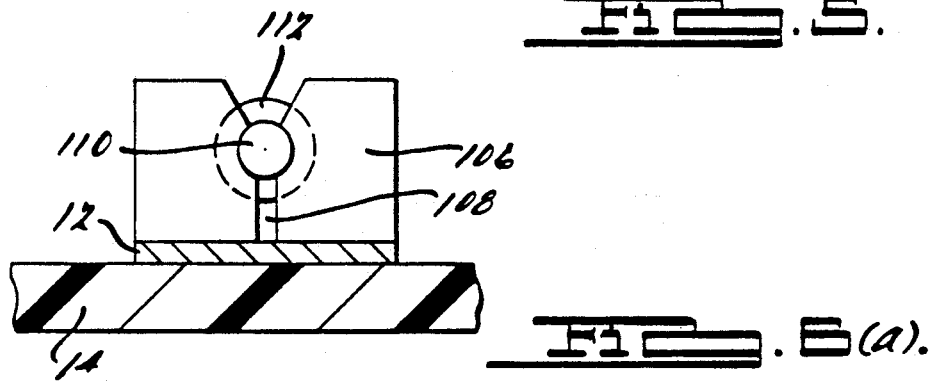
Figure 6B:
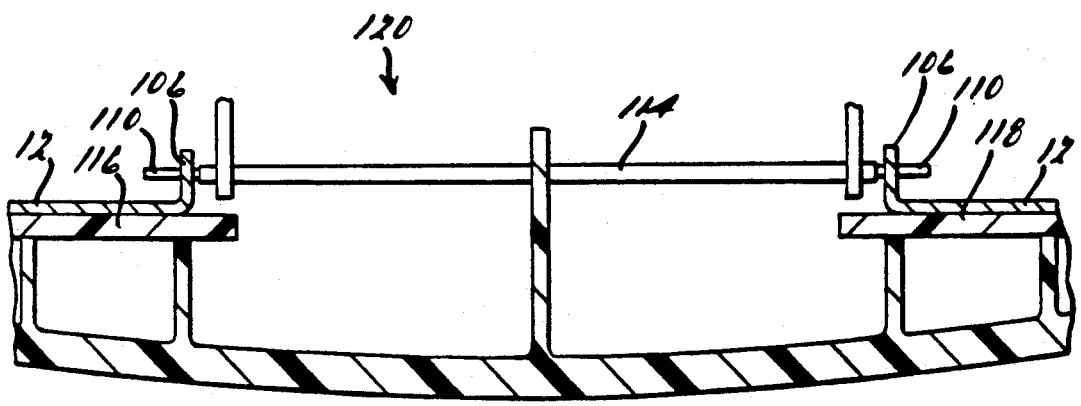

The apparatus 10 may also be used to form and secure component terminals to the substrates 14 as shown in FIGS. 6(a)-(d). A component terminal 106 is blanked to include a groove 108 for accommodating a lead 110 from a component 112. The component terminal 116 is then secured to the substrate 14 by mechanical interference in the manner described above. The component terminals 116 may be used for securing a wire 114 between two portions 116 and 118 of an electrical assembly 120 as shown in FIG. 6(b). The component terminals 106 may also be used for mechanical surface mounting an electrical component 122 as shown in FIG. 6(c), in which the lead 124 from a component 122 passes through an aperture 126 in the substrate 14 in which a portion 128 of the component terminal 106 is disposed. The end of the lead 124 is then bent to physically secure the component 122 to the substrate 14 as well as to provide for additional electrical connection. The substrate 14 may also include projections 130 which further secure the component 122 to the substrate as shown in FIG. 6(d).

The apparatus 10 can also be used to form a variety of switches 132 as shown in FIGS. 7(a)-(e). In FIG. 7(a), two stationary contacts 134 and 136 are formed and secured to a substrate 14 by mechanical interference in the manner described above. An actuator 138 is provided which mechanically communicates with a movable contact 140. The movable contact 140 is biased in a direction toward the stationary contact 134 by a spring 142. When the actuator 138 is laterally moved, the movable contact 140 mechanically communicates with both of the stationary contacts 134 and 136 thereby providing electrical communication therebetween. In FIG. 7(b), two conductors 144 and 146 are secured to the substrate by mechanical interference in the manner described above. The conductors 144 and 146 are vertically displaced to provide a gap therebetween. An actuator 148 may be used to close the gap between the conductors 144 and 146 permitting electrical communication therebetween. In FIG. 7(c), a deformed portion of the conductor 150 is disposed in an aperture 152 in the substrate 14. The conductors 150 and 154 can then be located close to the surface of the substrate 14 thereby minimizing the vertical space occupied by the switch 132. In FIG. 7(d), a first conductor 156 includes a first portion 158 which is elevated from the second conductor 160. The actuator 148 may then be used to close the electrical circuit by depressing the deformed portion 158 on to the conductor 160. In FIG. 7(e), the two conductors 164 and 166 are secured in the manner described above. The portions 168 and 170 of the conductors 164 and 166 are bent by 90 degrees with respect to the unbent portion. Contact between the conductors 164 and 166 is then made by allowing the actuator 148 to force the bent portion 168 of the conductor 164 against the bent portion 170 of the conductor 166.

The apparatus 10 may also be used to form a heat sink 174 as shown in FIG. 8, in which a conductor 176 having a projection 178 is deposited and secured on the substrate 14 by mechanical interference in the manner described above. The electronic module 180 is then secured to the conductor 176 through a thermally conducted adhesive causing heat from the electronic module 180 to flow into the conductor 176. The heat generated by the electronic module 180 then flows into the conductor 176 and is dissipated into the environment through the projection 178. In this embodiment, the substrate 14 may be used to distribute power to the electronic module 180 through a second conductor 182 and the stake header 184.

The apparatus 10 may also be used in the formation of a terminal block 186 as shown in FIGS. 9(a) and (b). The substrate 14 is formed having the retaining projections 188. The two conductors 190 and 192 are then formed and deposited on the substrate 14 in the manner described above. Two die cast retainers 194 and 196 are then inserted into the substrate 14 and are held in place by the retaining projections 188. The leads 198 from the cordset may then be inserted into the apertures 200 of the die cast retainers 194 and 196, whereupon the screws 202 are used to secure the leads 198 of the cordset. After the screws 202 have been tightened, the wires 204 of the cordset are disposed against the retaining projections 188.

The apparatus 10 may also be used to secure power cords to electrical units in the manner as shown in FIGS. 10(a) and (b). The power cord 206 includes a strain relief portion 208 which mates with the housing 210 of the unit 212. The cord 206 further includes two leads 214 and 216 which are secured to a substrate 14 by molded conductor retainers 218 and 220 in the substrate 14. Attached to the unit 212 are two conductors 222 and 224 having conductor terminals 226 and 228 formed and secured in the manner described above. The conductors 222 and 224 act as a bus to distribute current to various components in the unit 212. Alternatively, the conductors 222 and 224 may electrically communicate with the barrel terminals 226 and 228 which allow for direct insertion of the leads 214 and 216 as shown in FIG. 10(b).

While the above description constitutes the preferred embodiment of the invention, it would be appreciated that the invention is susceptible to modification, variation, and change without departing from the proper scope of a fair meaning of the accompanying claims.

What is claimed is:

1. A power distribution system formed during a punching operation, said power distribution system comprising:

an electrical conductor formed from a sheet of conductive material; and a substrate mechanically communicating with said conductor, said substrate including interengaging means for interengaging said electrical conductor with said substrate thereby creating mechanical interference between said substrate and said electrical conductor, said interengaging means comprising an opening in said substrate being operable to receive a portion of said conductor whereby to secure said electrical conductor to said substrate.

2. An electrical circuit board comprising:

a substrate having a first and second opposing surfaces; and an electrical conductor mechanically communicating with said substrate, said electrical conductor having interengaging means for interengaging said substrate with said electrical conductor thereby causing mechanical interference between said electrical conductor and said substrate, said interengaging means comprising a portion of said conductor extending from said first opposing surface to said second opposing surface of the substrate being operable to secure said electrical conductor to said substrate.

3. An electrical switch comprising:

a first electrical conductor operable to be formed from the sheet of conductive material during a punching operation;

a second electrical conductor operable to be formed from said sheet of conductive material during said punching operation; and a substrate having means for interengaging said first and second electrical conductors with said substrate, said means for interengaging being operable to secure said first and second electrical conductors during said punching operation by creating mechanical interference between said substrate and each of said first and second electrical conductors.

4. A power distribution system formed during a punching operation, said power distribution system comprising:

an electrical conductor formed from a sheet of conductive material; and a substrate mechanically communicating with said conductor, said substrate including interengaging means for interengaging said electrical conductor with said substrate thereby creating mechanical interference between said substrate and said electrical conductor, said interengaging means comprising a projection located on said substrate being operable to be deformed thereby securing said electrical conductor to said substrate.

5. An electrical circuit board comprising:

a substrate having a first and second opposing surfaces; and an electrical conductor mechanically communicating with said substrate, said electrical conductor having interengaging means for interengaging said substrate with said electrical conductor thereby causing mechanical interference between said electrical conductor and said substrate, said interengaging means comprising a portion of said electrical conductor being operable to be embedded into said substrate whereby to secure said electrical conductor to said substrate.

* * * * *